United States Patent
Jin et al.

(10) Patent No.: US 12,451,357 B2
(45) Date of Patent: Oct. 21, 2025

(54) SEMICONDUCTOR DEVICE AND MANUFACTURING METHOD THEREFOR

(71) Applicant: CSMC TECHNOLOGIES FAB2 CO., LTD., Jiangsu (CN)

(72) Inventors: Hongfeng Jin, Jiangsu (CN); Ruibin Cao, Jiangsu (CN); Feng Lin, Jiangsu (CN); Xiang Qin, Jiangsu (CN); Yu Huang, Jiangsu (CN); Chunxu Li, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 376 days.

(21) Appl. No.: 18/258,902

(22) PCT Filed: Jul. 27, 2021

(86) PCT No.: PCT/CN2021/108670
§ 371 (c)(1),
(2) Date: Jun. 22, 2023

(87) PCT Pub. No.: WO2022/134571
PCT Pub. Date: Jun. 30, 2022

(65) Prior Publication Data
US 2024/0047212 A1     Feb. 8, 2024

(30) Foreign Application Priority Data
Dec. 23, 2020   (CN) .......................... 202011541975.7

(51) Int. Cl.
*H01L 21/265* (2006.01)
*H01L 21/027* (2006.01)
(Continued)

(52) U.S. Cl.
CPC ...... *H01L 21/2652* (2013.01); *H01L 21/0274* (2013.01); *H01L 21/266* (2013.01); *H10D 30/0281* (2025.01); *H10D 30/65* (2025.01)

(58) Field of Classification Search
None
See application file for complete search history.

(56) References Cited

U.S. PATENT DOCUMENTS 6,635,925 B1 * 10/2003 Taniguchi .......... H10D 30/0221
                                                    257/E29.268
8,940,608 B2 *  1/2015 Feng ................... H10D 64/017
                                                    438/286
(Continued)

FOREIGN PATENT DOCUMENTS

| CN | 102487011 A | 6/2012 |
| CN | 104465779 A | 3/2015 |
| CN | 109119480 A | 1/2019 |

*Primary Examiner* — Alexander G Ghyka
(74) *Attorney, Agent, or Firm* — MUNCY, GEISSLER, OLDS & LOWE, P.C.

(57) ABSTRACT

A semiconductor device and a manufacturing method therefor are disclosed. The method includes: providing a substrate of a first conductivity type; forming doped regions of a second conductivity type in the substrate, the doped regions including adjacent first and second drift regions, wherein the second conductivity type is opposite to the first conductivity type; forming a polysilicon film on the substrate, the polysilicon film covering the doped regions; forming patterned photoresist on the polysilicon film, which covers the first and second drift regions, and in which the polysilicon film above a reserved region for a body region between the first and second drift regions is exposed; and forming the body region of the first conductivity type in the reserved region by performing a high-energy ion implantation process, the body region having a top surface that is flush with top surfaces of the doped regions, the body region having a bottom surface (Continued)

that is not higher than bottom surfaces of the doped regions. The problem of morphological changes possibly experienced by the photoresist due to a high temperature in an etching process, which may lead to an impaired effect of the high-energy ion implantation process, can be circumvented.

10 Claims, 4 Drawing Sheets

(51) Int. Cl.
*H01L 21/266* (2006.01)
*H10D 30/01* (2025.01)
*H10D 30/65* (2025.01)

(56) References Cited

U.S. PATENT DOCUMENTS

| | | | |
|---|---|---|---|
| 9,590,072 B1* | 3/2017 | Chou | H10D 84/0193 |
| 2008/0191276 A1* | 8/2008 | Chen | H10D 30/65 |
| | | | 257/E21.345 |
| 2015/0001615 A1* | 1/2015 | Yong | H10D 62/393 |
| | | | 438/270 |
| 2015/0372117 A1 | 12/2015 | Ko et al. | |
| 2022/0020863 A1* | 1/2022 | Han | H01L 21/0415 |
| 2022/0149186 A1* | 5/2022 | Edwards | H10D 62/156 |

* cited by examiner

Schematic Cross-sectional Views

Without Correction of Dimensional Deviations of Photomask Pattern

With Correction of Dimensional Deviations of Photomask Pattern

SEMICONDUCTOR DEVICE AND MANUFACTURING METHOD THEREFOR

TECHNICAL FIELD

This application relates to the field of semiconductor technology and, in particular, to a semiconductor device and a method of manufacturing the same.

BACKGROUND

For NLDMOS devices operating in the medium and low voltage range of 7-45 V, a substantially consistent channel fabrication process is employed, which involves: polysilicon grow; p-body photolithography (PB PHO), polysilicon etching and p-body implantation (PB IMP). Self-alignment techniques can greatly shorten, and ensure stability of, a channel length of such an NLDMOS device. As semiconductor technology is developing and advancing, a greater PB IMP depth is always desired to ensure sufficiently low Vt that can prevent the triggering of a parasitic NPN transistor and enhance the NLDMOS device's BV_on and TLP (transmission line pulse) capabilities. Accordingly, it is necessary to increase a PB PHO photoresist thickness in the conventional "polysilicon growth+PB PHO+polysilicon etching+ PB IMP" process in order to enable the photoresist to block ions implanted with high energy and protect what is covered by the photoresist. However, high-energy ion implantation is associated with the following problems: 1) 193-nm DUV lithography typically employs a photoresist thickness <1.3 μm, which is not sufficient to block ions implanted with high energy, but thicker DUV photoresist would be too expensive; 2) photoresist may experience significant morphological changes caused by shrinkage during high-energy ion implantation, which will lead to an increased concentration of implanted p-type ions in a channel region of an LDMOS device and hence undesirably higher Vt; 3) at a given varying pitch, there are significant differences in Vt consistency among LDMOS devices operating in different ranges.

SUMMARY

In view of this, it is necessary to provide a semiconductor device and a method of manufacturing the same in order to overcome the above-described problems.

A method of manufacturing a semiconductor device includes:
provide a substrate of a first conductivity type;
forming doped regions of a second conductivity type in the substrate, the doped regions including adjacent first and second drift regions, wherein the second conductivity type is opposite to the first conductivity type;
forming a polysilicon film on the substrate, the polysilicon film covering the doped regions;
forming patterned photoresist on the polysilicon film, which covers the first and second drift regions, and in which the polysilicon film above a reserved region for a body region between the first and second drift regions is exposed; and
forming the body region of the first conductivity type in the reserved region by performing a high-energy ion implantation process, the body region having a top surface that is flush with top surfaces of the doped regions, the body region having a bottom surface that is not higher than bottom surfaces of the doped regions.

In one embodiment, the step of forming the doped regions of the second conductivity type in the substrate may include:
forming the doped regions by implanting ions of the second conductivity type into the substrate,
wherein the doped regions includes the first drift region, the second drift regions and the reserved region between the first and second drift regions.

In one embodiment, the step of forming the patterned photoresist on the polysilicon film may include:
forming patterned i-line photoresist on the polysilicon film, the patterned photoresist having a thickness that is greater than or equal to 1.6 microns and less than or equal to 2.5 microns.

In one embodiment, the step of performing the high-energy ion implantation process may include:
performing the high-energy ion implantation process with implantation energy that is higher than or equal to 500 KeV and lower than or equal to 800 KeV.

In one embodiment, the step of forming the patterned photoresist on the polysilicon film may include:
correcting dimensional deviations of a photomask pattern according to lengths of the first and second drift regions and thereby obtaining a new photomask pattern, wherein the lengths are measured in the direction of a line connecting the first and second drift regions;
fabricating a photomask according to the new photomask pattern; and
forming new patterned photoresist on the polysilicon film using the photomask,
wherein subsequent to the high-energy ion implantation process, photoresist portions of the new patterned photoresist above the first and second drift regions have equal angles which are defined as sidewall-to-bottom angles of the photoresist portions.

In one embodiment, the steps of correcting the dimensional deviations of the photomask pattern according to the lengths of the first and second drift regions and thereby obtaining the new photomask pattern may be accomplished by optical proximity correction.

In one embodiment, the method may further include, subsequent to the high-energy ion implantation process,
removing the polysilicon film above the reserved region using an etching process, resulting in the formation of a polysilicon layer constituted by the remainder of the polysilicon film.

In one embodiment, a length of the top surface of each body region may be greater than a length of the bottom surface of the specific body region.

A semiconductor device is made by the method as defined in any of the preceding paragraphs.

In one embodiment, the semiconductor device may include a laterally diffused metal-oxide semiconductor device.

In the above-described method, after the patterned photoresist is formed, which covers the polysilicon film above the first and second drift regions, and in which the reserved region between the first and second drift regions is exposed, the body region of the first conductivity type is formed in the reserved region by means of high-energy ion implantation. By contrast, when the polysilicon film above the reserved region is etched away prior to the high-energy ion implantation process, the etching process may thin the photoresist portions above the first and second drift regions. This necessitates increasing the photoresist's thickness in order to enable it to sufficiently block ions in the subsequent high-energy ion implantation process, which may lead to increases in fabrication cost and complexity of the semiconductor device. Moreover, the problem of morphological changes possibly experienced by the photoresist due to a high temperature in the etching process, which may lead to an impaired effect of the high-energy ion implantation process, can be circumvented.

BRIEF DESCRIPTION OF THE DRAWINGS

In order to more clearly explain the techniques of the present invention or the prior art, the accompanying drawings, to which reference is to be made in connection with the following description of embodiments or the prior art, will be briefed below. Apparently, these drawings show only some embodiments of the invention, and those of ordinary skill in the art can obtain other drawings in light of those contained herein, without paying any creative effort.

DETAILED DESCRIPTION

Figure 1:
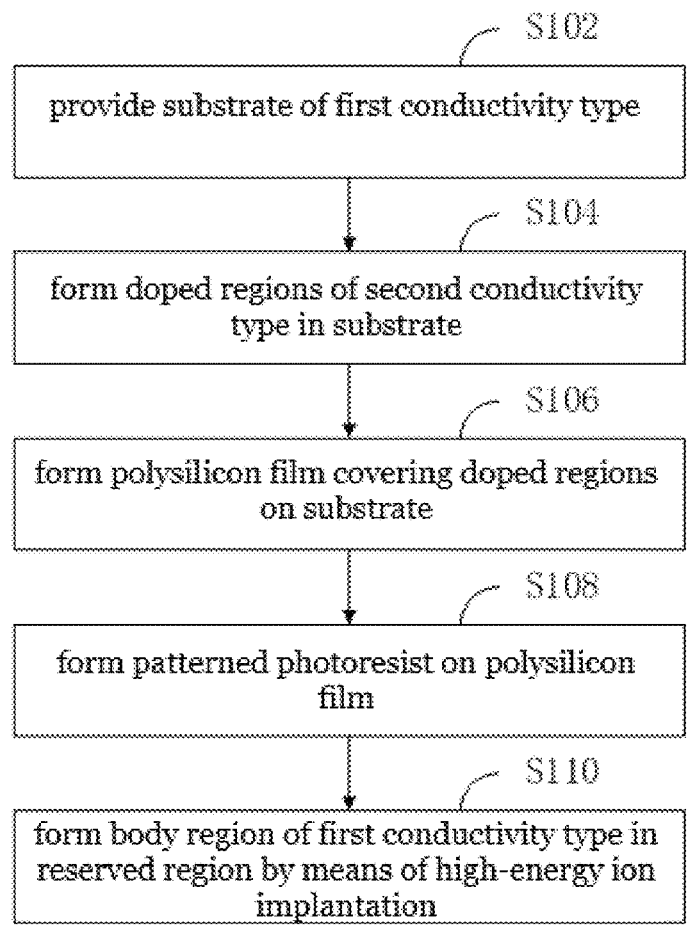
FIG. 1 is a flow diagram of a method for manufacturing a semiconductor device according to an embodiment.

In order to facilitate an understanding of the present application, the application is described more fully below with reference to the accompanying drawings, which show preferred embodiments for practicing the application. However, this application may be implemented in many different forms and should not be construed as being limited to the embodiments set forth herein. Rather, these embodiments are provided so that this disclosure will be thorough and complete.

Unless defined otherwise, all technical and scientific terms used herein have the same meaning as commonly understood by one of ordinary skill in the art to which this invention belongs. The terminology used herein is for the purpose of describing particular embodiments only and is not intended to be limiting of this invention.

It will be understood that when an element or a layer is referred to as being "on", "adjacent to", "connected to" or "coupled to" another element or layer, it can be directly on, adjacent to, or connected or coupled to the other element or layer, or intervening elements or layers may also be present. In contrast, when an element is referred to as being "directly on" "directly adjacent to", "directly connected to" or "directly coupled to" another element, there are no intervening elements or layers present. It will be understood that although the terms first, second, third, etc. may be used herein to describe various elements, components, regions, layers and/or sections, these elements, components, regions, layers, doping types and/or sections should not be limited by these terms. These terms are only used to distinguish one element, component, region, layer, doping type or section from another element, component, region, layer, doping type or section. Thus, a first element, component, region, layer, doping type or section discussed below could be termed a second element, component, region, layer, doping type or section without departing from the teachings of the present invention. For example, a first doping type could be termed as a second doping type. Similarly, the second doping type could be termed as the first doping type. The first and second doping types are different doping types. For instance, the first doping type may be p-type and the second doping type may be n-type. Alternatively, the first doping type may be n-type and the second doping type may be p-type.

Spatially relative terms, such as "under", "below", "lower", "beneath," "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under", "below" or "beneath" other elements or features would then be oriented "over" the other elements or features. Thus, the exemplary terms "under" and "beneath" can encompass both an orientation of "over" and "under". The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. It will be further understood that the terms "comprises" and/or "comprising", when used in this specification, specify the presence of stated features, integers, steps, operations, components, sections or groups thereof, but do not preclude the presence or addition of one or more other features, integers, steps, operations, components, sections or groups thereof. As used herein, the term "and/or" includes any and all combinations of one or more of the associated listed items.

Embodiments of the present invention are described herein with reference to cross-sectional and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

In a typical process for manufacturing a semiconductor device, the formation of a body region includes the steps as follows. Step 1: the formation of a polysilicon film: grow a polysilicon film over a p-type substrate formed therein with two n-type drift regions. Step 2: the formation of a patterned photoresist for the body region: form a patterned photoresist for the body region on the polysilicon film using a photomask for body region formation, which covers the n-type drift regions, and in which a reserved region for the body region between the adjacent n-type drift regions (i.e., a portion of the substrate between the adjacent drift regions) is exposed. The patterned photoresist defines a self-aligned implantation location for the body region. Step 3: the formation of a polysilicon layer by etching: etch away the polysilicon film in the reserved region that is exposed in the patterned photoresist. The remainder of the polysilicon film constitutes a polysilicon layer. Step 4: implantation for body region: form the p-type body region between the adjacent drift regions by implanting p-type ions, with the patterned photoresist and the polysilicon layer serving as barrier layers.

In order to further reduce Vt of the semiconductor device, which facilitates preventing the triggering of a parasitic NPN transistor and enhancing BV_on and TLP capacities of the NLDMOS device, it is desirable to increase an implantation depth of the implantation process for forming the body region. However, when such an increased implantation depth is to be accomplished by using higher implantation energy in the implantation process, ions may penetrate through the patterned photoresist and the polysilicon layer into the n-type drift regions under the action of such higher implantation energy, leading to the formation of p-type doped regions between the n-type drift regions and the polysilicon layer. Moreover, during the high-energy ion implantation, the patterned photoresist may shrink significantly, leading to a much thinner photoresist thickness above the drift regions in vicinity of the body region. As a consequence, high-energy ions may penetrate through the photoresist above the drift regions in proximity to the body region into the substrate, leading to extensions of the body region, which adversely affect a channel length of the semiconductor device.

Reference is now made to FIG. 1, a flow diagram of a method for manufacturing a semiconductor device according to an embodiment.

In order to overcome the above-described problem, as shown in FIG. 1, the method provided in this application includes the steps as follows.

S102: Provide a substrate of a first conductivity type.

The substrate may be implemented as a monocrystalline silicon, silicon on insulator (SOI), strained silicon-on-insulator (SSOI), strained silicon germanium on insulator (S—SiGeOI), silicon germanium on insulator (SiGeOI), germanium on insulator (GeOI) substrate formed on a surface thereof with a doped layer of the first conductivity type. Alternatively, it may be implemented as a monocrystalline silicon, silicon on insulator (SOI), strained silicon-on-insulator (SSOI), strained silicon germanium on insulator (S—SiGeOI), silicon germanium on insulator (SiGeOI), germanium on insulator (GeOI) or another substrate doped with a dopant of the first conductivity type. As an example, in this embodiment, the substrate is a p-type silicon substrate (P-sub). The present invention is not limited to any particular dopant concentration of the substrate.

S104: Form doped regions of a second conductivity type in the substrate.

The doped regions include adjacent first and second drift regions. The second conductivity type is opposite to the first conductivity type. When the first conductivity type is p-type, the second conductivity type is n-type. When the first conductivity type is n-type, the second conductivity type is p-type. In this embodiment, the first conductivity type is p-type and the second conductivity type is n-type.

S106: Form a polysilicon film on the substrate, which covers the doped regions.

S108: Form patterned photoresist on the polysilicon film.

The patterned photoresist covers the first and second drift regions, and the polysilicon film in a reserved region for a body region between the first and second drift regions exposed in the patterned photoresist. That is, the photoresist resides on the polysilicon film above the first and second drift regions, with the polysilicon film being exposed between the first and second drift regions.

S110: Form a body region of the first conductivity type in the reserved region by means of high-energy ion implantation.

A top surface of the body region is flush with top surfaces of the doped regions. Moreover, a bottom surface of the body region is not higher than bottom surfaces of the doped regions.

Specifically, a high-energy ion implantation process is performed on the substrate that is surface-coated with the patterned photoresist to implant dopant ions of the first conductivity type into a portion of the substrate between the first and second drift regions (i.e., the reserved region), resulting in the formation of the body region that connect the first and second drift regions. The body region is of the first conductivity type. The top surface of the body region is flush with the top surfaces of the doped regions. The bottom surface of the body region is not higher than the bottom surfaces of the doped regions. That is, the top surface of the body region is flush with a top surface of the substrate, while the bottom surface of the body region is in contact with the substrate under the doped regions. The body region is in contact with the first drift region on one side and with the second drift region on the other side.

In one embodiment, step S104 includes forming the first and second drift regions in the substrate by implanting therein ions of the second conductivity type. The first and second drift regions are separated from each other by the substrate between them. Thus, the reserved region where the body region is to be subsequently formed is of the first conductivity type and forms part of the substrate.

Figure 2:
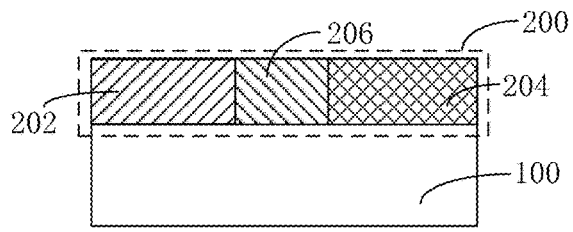
FIG. 2 is a schematic cross-sectional view of a semiconductor device resulting from the formation of doped regions in a substrate in Embodiment 1.

Reference is now made to FIG. 2, a schematic cross-sectional view of a semiconductor device resulting from the formation of the doped regions in the substrate in Embodiment 1.

As shown in FIG. 2, in one embodiment, step S104 includes:

forming doped regions 200 in the substrate 100 by implanting therein ions of the second conductivity type. The doped regions 200 includes a first drift region 202, a second drift region 204 and a region 206 reserved for the body region between the first drift region 202 and the second drift region 204. The reserved region 206 is of the second conductivity type and has the same concentration of dopant ions of the second conductivity type as the first drift region 202 and the second drift region 204. In comparison with the case where the reserved region of the first and second drift regions is a portion of the substrate, this embodiment can prevent undesirable alignment between edges of the body region and those of the first and second drift regions on opposing sides thereof due to different alignment accuracies of photolithography machines used to form different patterned photoresists, through forming the three doped regions 200 by ion implantation, i.e., the first drift region 202, the second drift region 204 and the reserved region 206 between the first drift region 202 and the second drift region 204. The following description is made in the exemplary context of the doped regions 200 including the first drift region 202, the second drift region 204 and the reserved region 206 between the first drift region 202 and the second drift region 204.

In one embodiment, step S108 includes:

forming patterned I-line photoresist on the polysilicon film. The patterned photoresist has a thickness that is greater than or equal to 1.6 microns and less than or equal to 2.5 microns.

Figure 3:
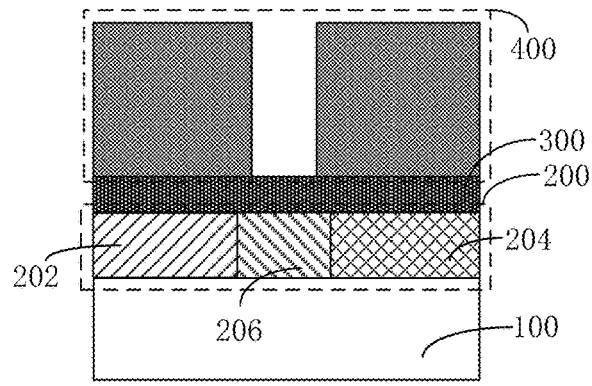
FIG. 3 is a schematic cross-sectional view of a semiconductor device resulting from the formation of patterned photoresist in the semiconductor device of FIG. 2.

Reference is now made to FIG. 3, a schematic cross-sectional view of a semiconductor device resulting from the formation of the patterned photoresist in the semiconductor device of FIG. 2.

As shown in FIG. 3, subsequent to the formation of the polysilicon film 300 covering the doped regions 200 in the substrate 100, the patterned photoresist 400 is formed on the polysilicon film 300. The patterned photoresist 400 resides on the polysilicon film 300 above the first and second drift regions, while the polysilicon film 300 above the reserved region 206 is exposed in the patterned photoresist 400. Specifically, the formation of the patterned photoresist 400 may include the steps as follows. Step 1: Coat a predetermined thickness of photoresist on a surface of the polysilicon film 300. The predetermined thickness is such a thickness that enables the photoresist to block high-energy ions implanted in the subsequent high-energy ion implantation process from entering the doped regions 200 under the photoresist. Step 2: Patterning the photoresist 400 by performing an exposure process using a photomask for body region formation and then a development process on the photoresist coated on the polysilicon film 300 so that the polysilicon film 300 above the reserved region 206 is exposed.

In one embodiment, step S110 includes:

performing a high-energy ion implantation with implantation energy that is higher than or equal to 500 KeV and lower than or equal to 800 KeV.

Figure 4:
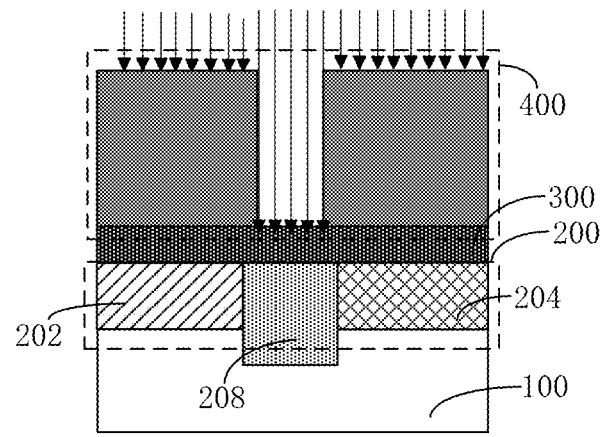
FIG. 4 is a schematic cross-sectional view of a semiconductor device resulting from the formation of a body region in the semiconductor device of FIG. 3.

Reference is now made to FIG. 4, a schematic cross-sectional view of a semiconductor device resulting from the formation of the body region in the semiconductor device of FIG. 3.

As shown in FIG. 4, with the patterned photoresist 400 serving as a mask, dopant ions of the first conductivity type are implanted with high energy into the reserved region 206, resulting in the formation of the body region 208. The bottom of the body region 208 is not higher than the bottoms of the doped regions 200.

In one embodiment, the first conductivity type is p-type, and the dopant ions implanted in the high-energy ion implantation process include boron ions.

Figure 5:
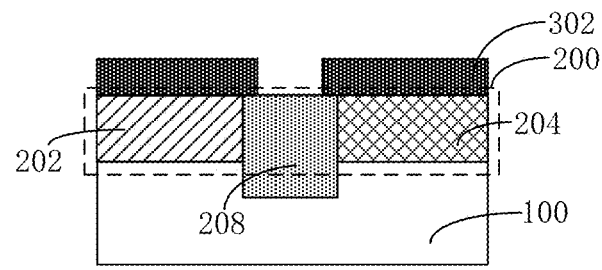
FIG. 5 is a schematic cross-sectional view of a semiconductor device resulting from the removal of the patterned photoresist from the semiconductor device of FIG. 4.

Reference is now made to FIG. 5, a schematic cross-sectional view of a semiconductor device resulting from the removal of the patterned photoresist from the semiconductor device of FIG. 4.

In one embodiment, the method further includes, subsequent to step S110, etching away the polysilicon film above the reserved region. The remainder of the polysilicon film constitutes a polysilicon layer.

In one embodiment, the method further includes, subsequent to the removal of the polysilicon film above the reserved region, removing the patterned photoresist above the substrate surface.

As shown in FIG. 5, after the body region 208 is formed, an etching process is performed to remove the polysilicon film 300 exposed in the patterned photoresist 400, and the remainder of the polysilicon film 300 constitutes the polysilicon layer 302. Following this, the patterned photoresist 400 over the substrate 100 is removed using a photoresist removal method well known to those skilled in the art. If the etching process precedes the implantation process, the etching process may adversely affect the thickness and morphology of the patterned photoresist. This can be prevented by removing the polysilicon film above the body region that is exposed in the patterned photoresist 400 after the body region has been formed.

Figure 6:
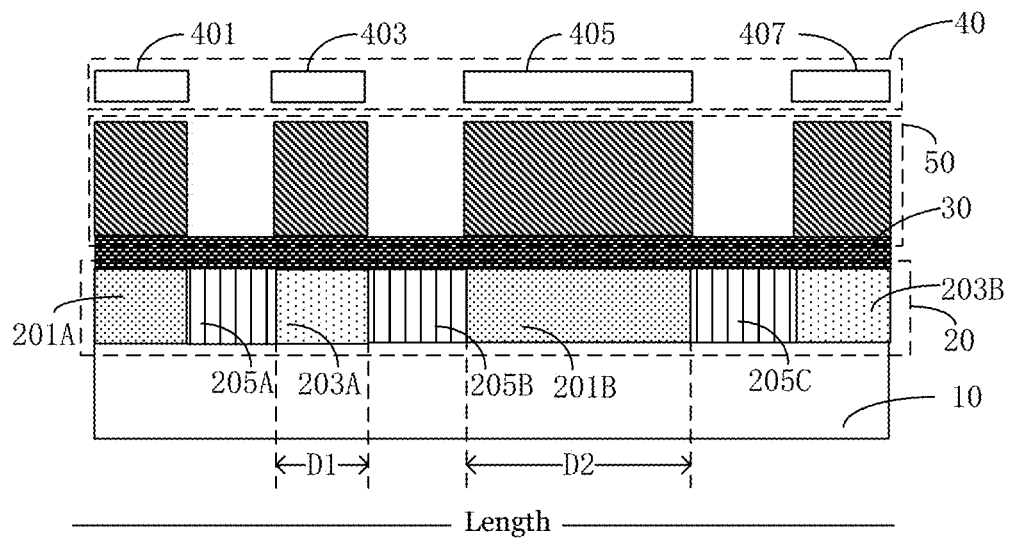
FIG. 6 is a side view of a semiconductor device resulting from the formation of patterned photoresist using a conventional photomask in Embodiment 2.
Figure 7:
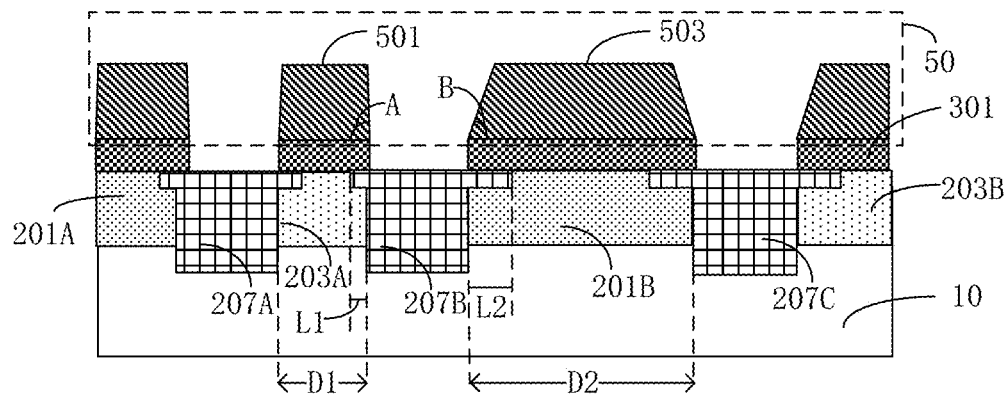
FIG. 7 is a schematic cross-sectional view of a semiconductor device resulting from the formation of a polysilicon layer in the semiconductor device of FIG. 6.
Figure 8:
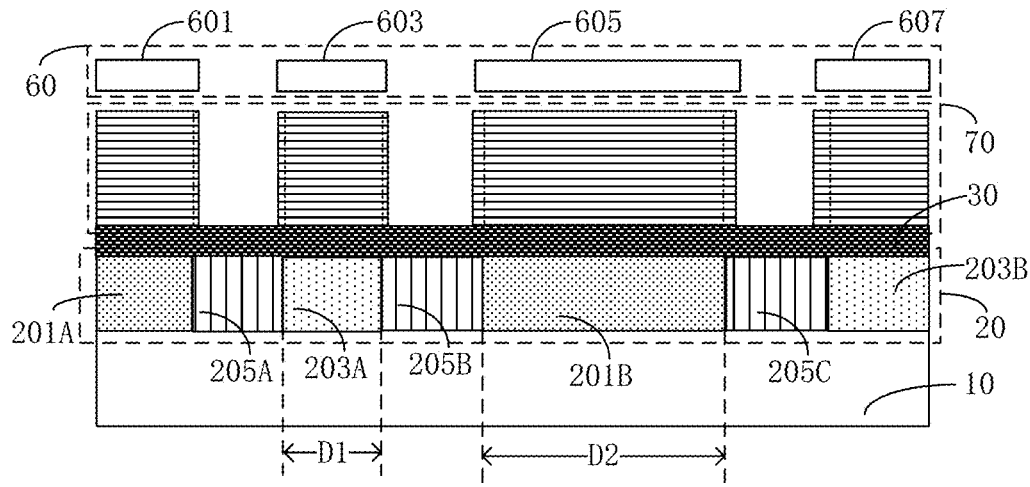
FIG. 8 is a side view of a semiconductor device resulting from the formation of patterned photoresist using a photomask obtained by correcting dimensional deviations of a photomask pattern of the photomask in Embodiment 2.
Figure 9:
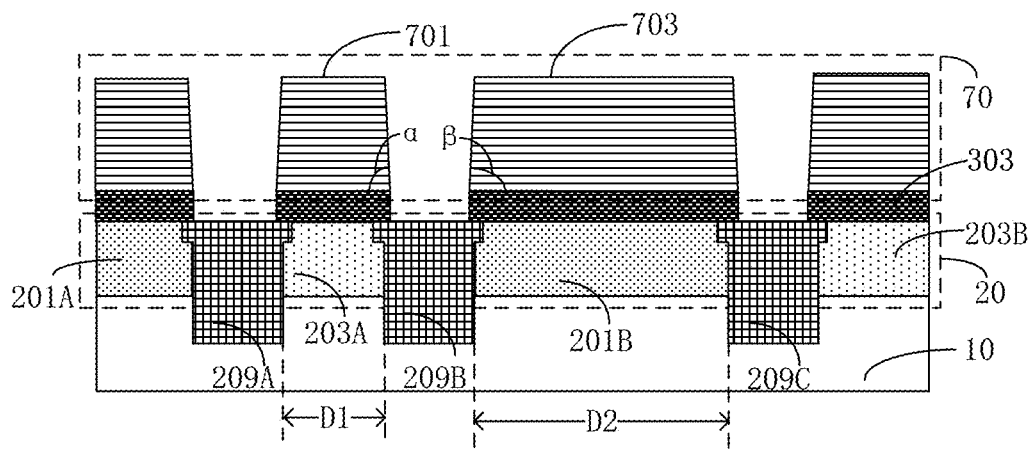
FIG. 9 is a schematic cross-sectional view of a semiconductor device resulting from the formation of a polysilicon layer in the semiconductor device of FIG. 8.

FIG. 6 is a side view of a semiconductor device resulting from the formation of patterned photoresist using a conventional photomask in Embodiment 2. FIG. 7 is a schematic cross-sectional view of a semiconductor device resulting from the formation of a polysilicon layer in the semiconductor device of FIG. 6. FIG. 8 is a side view of a semiconductor device resulting from the formation of patterned photoresist using a photomask obtained by correcting dimensional deviations of a photomask pattern of the photomask in Embodiment 2. FIG. 9 is a schematic cross-sectional view of a semiconductor device resulting from the formation of a polysilicon layer in the semiconductor device of FIG. 8.

As shown in FIGS. 6 and 7, doped regions 20 are formed in a substrate 10, and a polysilicon film 30 covering the doped regions 20 is formed on the substrate 10. The doped regions 20 include a first doped region 201A, a first doped region 201B, a second doped region 203A, a second doped region 203B, a reserved region 205A for a body region, a reserved region 205B for a body region and a reserved region 205C for a body region. An exposure process using a conventional photomask 40 for body region formation and a subsequent development process are performed on photoresist coated on the polysilicon film 30 to form first patterned photoresist 50. A length D1 of the second doped region 203A is less than a length D2 of the first doped region 201B. With the first patterned photoresist 50 and the polysilicon film 30 serving as barrier layers, a high-energy ion implantation is performed to form a body region 207A in the reserved region 205A, a body region 207B in the reserved region 205B and a body region 207C in the reserved region 205C. After that the polysilicon film 30 not covered by the photoresist is etched away, resulting in a polysilicon layer 301 consisting of the remainder of the polysilicon film Since the length D1 of the second doped region 203A is less than the length D2 of the first doped region 201B, during the high-energy ion implantation process, the photoresist 501 above the second drift region 203A shrink by a smaller amount than the photoresist 503 above the first drift region 201B. As a consequence, after the high-energy ion implantation process, an angle A between a sidewall and the bottom of the photoresist 501 is greater than an angle B between a sidewall and the bottom of the photoresist 503. As a result of penetration of dopant ions of the first conductivity type through the patterned photoresist 50 that has shrunk during the high-energy ion implantation process, in the body region 207B, a length L1 of a doped region of the first conductivity type under the photoresist 501 is less than a length L2 of a doped region of the first conductivity type under the photoresist 503. NLDMOS devices operating in different voltage ranges have different drift region sizes. A higher withstand voltage requires larger drift regions and hence a longer channel between the drift regions. That is, at a given distance between the adjacent drift regions, the length of the channel between the doped regions may vary.

In one embodiment, step S108 includes the steps as follows.

Step 1: According to the lengths of the first and second drift regions, correct dimensional deviations of the photomalsk pattern and thus obtain a new photomask pattern. The lengths are measured along the direction of a line connecting the first and second drift regions. Step 2: Fabricate a photomask based on the new photomask pattern. Step 3: Form new patterned photoresist on the polysilicon film using said photomask. In this way, after the high-energy ion implantation, portions of the new patterned photoresist respectively above the first and second drift regions have the same angle. Here, the angle refers to an angle between a sidewall and the bottom of each of the photoresist portion. Correcting dimensional deviations of the photomask pattern according to the lengths of the first and second drift regions can eliminate the difference in the amount of photoresist shrinkage caused by the different drift region lengths, thereby overcoming the problems of body regions with different lengths (different channel lengths) formed in the equally long reserved regions in the high-energy ion implantation process.

Specifically, with reference to FIGS. 6, 8 and 9, in Step 1, the length X1 of the first drift region 201A, the length X2 of the first drift region 201B, the length Y1 of the second drift region 203A and the length Y2 of the second drift region 203B, among the doped regions 20 in the substrate 10, are obtained, and dimensional deviations of a first pattern feature 401, a second pattern feature 403, a third pattern feature 405 and a fourth pattern feature 407 in the photomask pattern of the photomask 40 are corrected according to the lengths X1, X2, Y1, Y2. As a result, a new photomask pattern is obtained. In Step 2, a photomask 60 is made based on the new photomask pattern. The photomask 60 includes a new first pattern feature 601, a new second pattern feature 603, a new third pattern feature 605 and a new fourth pattern feature 607. In Step 3, an exposure process using the photomask 60 and a subsequent development process are carried out on the photoresist coated on the polysilicon film 30, resulting in the formation of a second patterned photoresist 70. In comparison with the first patterned photoresist 50, the photoresist portions above the reserved regions 205A, 205B, 205C encircled by the dashed-line boxes in FIG. 8 are newly added photoresist portions. As a result of a high-energy ion implantation process using the second patterned photoresist and the polysilicon film 30 as barrier layers, a body region 209A is formed in the reserved region 205A, a body region 209B in the reserved region 205B and a body region 209C in the reserved region 205C. After that, the polysilicon film not covered by the photoresist is etched away, resulting in the formation of a polysilicon layer 303 constituted by the polysilicon film. An angle α between a sidewall and the bottom of the photoresist 701 above the second drift region 203A is equal to an angle β between a sidewall and the bottom of the photoresist 503 above the first drift region 201B.

Although an amount of shrinkage of the photoresist 701 above the second drift region 203A is less than an amount of shrinkage of the photoresist 703 above the first drift region 201B during the high-energy ion implantation process because the length D1 of the second doped region 203A is less than the length D2 of the first doped region 201B, the dimensional offsets added to the photomask pattern of the photomask eliminate the influence of the amounts of shrinkage of the photoresist portions on their sidewall-to-bottom angles after the high-energy ion implantation process. As a result, in the body region 209B, a length of a doped region of the first conductivity type under the photoresist 901 is equal to a length of a doped region of the first conductivity type under the photoresist 703. For NLDMOS devices operating in different voltage ranges, although the adjacent drift region have different sizes, as long as the distance between them is consistent, a consistent channel length can be obtained between these doped regions.

Specifically, it is assumed that a first pattern feature in the photomask pattern corresponding to the first drift region has a length of M0 and a second pattern feature corresponding to the second drift region has a length of N0. First, among the doped regions in the substrate, a length of the first drift region is obtained as M1, and a length of the second drift region as N1. Additionally, a length of a body region section in the first drift region is obtained as M2, and a length of a body region section in the second drift region as N2. Next, according to the length M0 of the first pattern feature, the length N0 of the second pattern feature, the length M1 of the first drift region, the length N1 of the second drift region, the length M2 of the body region section in the first drift region and the length N2 of the body region section in the second drift region, the length of the first pattern feature is modified to M and the length of the second pattern feature to N. For example, the length M of the first pattern feature and the length N of the second pattern feature are determined by adding the differences between the length M2 of the body region section in the first drift region and length N2 of the body region section in the second drift region and respective preset values respectively to the first and second pattern features so that the lengths of the body region sections in the first and second drift regions are the respective preset values. The new photomask pattern is then obtained according to the length M of the first pattern feature and the length N of the second pattern feature, and the new photomask is fabricated based on the new photomask pattern. Subsequently, the patterned photoresist is formed on the polysilicon film using the new photomask. As a result, the sidewall-to-bottom angle of the photoresist above the first drift region is equal to the sidewall-to-bottom angle of the photoresist above the second drift region.

Figure 10:
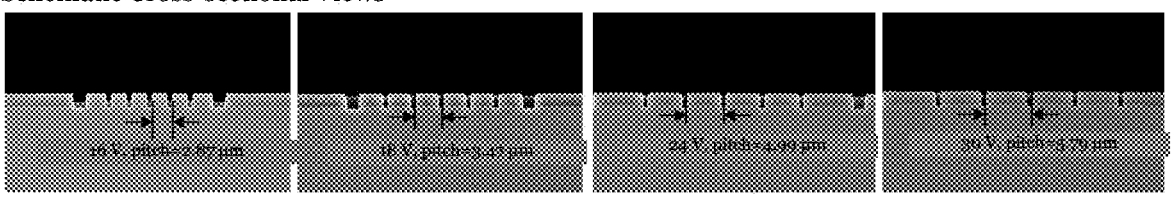
FIG. 10 shows schematic cross-sectional views of 16V, 18V, 24V and 32V NLDMOS devices after respective polysilicon layers are formed by etching.
Figure 10:
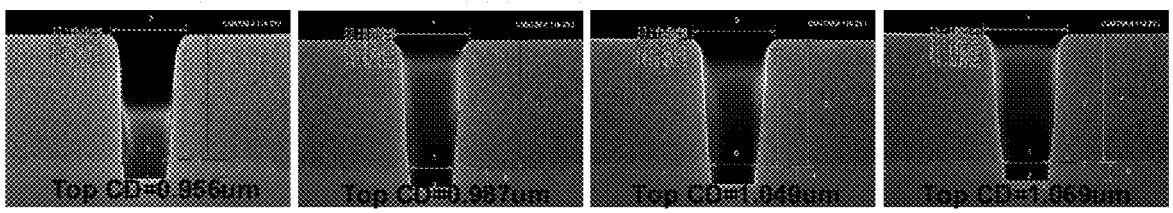
Figure 10:
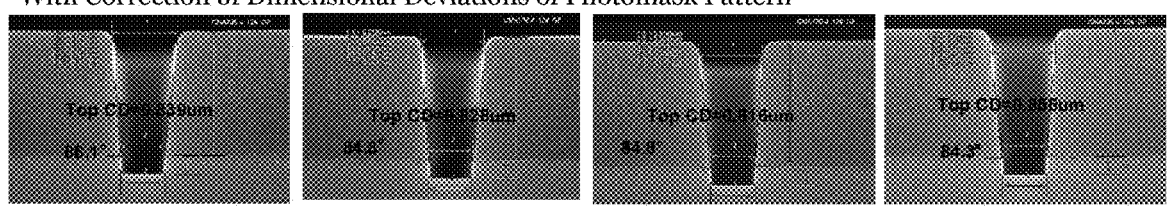

FIG. 10 shows schematic cross-sectional views of 16V, 18V, 24V and 32V NLDMOS devices after polysilicon layers are formed by etching. As shown, the "pitch" is defined as the sum of a length of one drift region and its distance from an adjacent drift region. As can be seen from the figure, without correction of dimensional deviations of photomask patterns according to drift region lengths, a greater drift region length (and hence a higher operating voltage of the semiconductor device) leads to a wide distance (Top CD) between photoresist portions above adjacent drift regions, i.e., a greater channel length of the device. With correction of dimensional deviations of photomask patterns according to drift region lengths, the distance (Top CD) between photoresist portions above adjacent drift regions, i.e., the channel length of the device, stays within a predetermined range and does not vary with the drift region length (and hence the operating voltage of the semiconductor device). Furthermore, photoresist portions above drift regions maintain a substantially consistent sidewall-to-bottom angle.

In one embodiment, the step of obtaining the new photomask pattern by correcting dimensional deviations of the original photomask pattern according to the lengths of the first and second drift regions is accomplished using optical proximity correction.

In one embodiment, a length of each body region at the top is greater than a length of the specific body region at the bottom. That is, the body regions are structures wider at the top and narrower at the bottom.

A semiconductor device is made by the method according to any of the foregoing embodiments.

In one embodiment, the semiconductor device includes a laterally diffused metal-oxide semiconductor device.

In the above-described method, after the patterned photoresist is formed, which covers the polysilicon film above the first and second drift regions, and in which the reserved region between the first and second drift regions is exposed, the body region of the first conductivity type is formed in the reserved region by means of high-energy ion implantation. By contrast, when the polysilicon film above the reserved region is etched away prior to the high-energy ion implantation process, the etching process may thin the photoresist portions above the first and second drift regions. This necessitates increasing the photoresist's thickness in order to enable it to sufficiently block ions in the subsequent high-energy ion implantation process, which may lead to increases in fabrication cost and complexity of the semiconductor device. Moreover, the problem of morphological changes possibly experienced by the photoresist due to a high temperature in the etching process, which may lead to an impaired effect of the high-energy ion implantation process, can be circumvented.

Reference throughout this specification to "some embodiments", "other embodiments", "idealized embodiments" or the like means that a particular feature, structure, material, or characteristic described in connection with the embodiments or examples is included in at least one embodiment or example of the invention. Thus, the appearances of those phrases in various places throughout this specification are not necessarily referring to the same embodiment or example of the invention.

The various technical features of the foregoing embodiments may be combined in any way. Although not all such combinations have been described above for the sake of brevity, any of them is considered to fall within the scope of this specification as long as there is no contradiction between the technical features.

Presented above are merely several embodiments of the present invention. Although these embodiments are described with some particularity and in some detail, it should not be construed that they limit the scope of the present application in any sense. It should be noted that various variations and modifications can be made by those of ordinary skill in the art without departing from the concept of the present application. Accordingly, it is intended that all such variations and modifications are embraced within the scope of this application as defined in the appended claims.

What is claimed is:

1. A method of manufacturing a semiconductor device, comprising:
    providing a substrate of a first conductivity type;
    forming doped regions of a second conductivity type in the substrate, the doped regions including adjacent first and second drift regions, wherein the second conductivity type is opposite to the first conductivity type;
    forming a polysilicon film on the substrate, the polysilicon film covering the doped regions;
    forming patterned photoresist on the polysilicon film, wherein the patterned photoresist covers the first and second drift regions, and a portion of the polysilicon film above a reserved region for a body region between the first and second drift regions is exposed in the patterned photoresist; and
    forming the body region of the first conductivity type in the reserved region by performing a high-energy ion implantation process, the body region having a top surface that is flush with top surfaces of the doped regions, the body region having a bottom surface that is not higher than bottom surfaces of the doped regions.

2. The manufacturing method of claim 1, wherein the step of forming the doped regions of the second conductivity type in the substrate comprises:
    forming the doped regions by implanting ions of the second conductivity type into the substrate,
    wherein the doped regions includes the first drift region, the second drift regions and the reserved region between the first and second drift regions.

3. The manufacturing method of claim 1, wherein the step of forming the patterned photoresist on the polysilicon film comprises:
    forming patterned I-line photoresist on the polysilicon film, the patterned photoresist having a thickness that is greater than or equal to 1.6 microns and less than or equal to 2.5 microns.

4. The manufacturing method of claim 1, wherein the step of performing the high-energy ion implantation process comprises:
    performing the high-energy ion implantation process with implantation energy that is higher than or equal to 500 KeV and lower than or equal to 800 KeV.

5. The manufacturing method of claim 1, wherein the step of forming the patterned photoresist on the polysilicon film comprises:
    correcting dimensional deviations of a photomask pattern according to lengths of the first and second drift regions and thereby obtaining a new photomask pattern, wherein the lengths are measured in the direction of a line connecting the first and second drift regions;
    fabricating a photomask according to the new photomask pattern; and
    forming new patterned photoresist on the polysilicon film using the photomask,
    wherein subsequent to the high-energy ion implantation process, photoresist portions of the new patterned photoresist above the first and second drift regions have equal angles which are defined as the included angle between a sidewall and a bottom of the photoresist portions.

6. The manufacturing method of claim 5, wherein the steps of correcting the dimensional deviations of the photomask pattern according to the lengths of the first and second drift regions and thereby obtaining the new photomask pattern is accomplished by optical proximity correction.

7. The manufacturing method of claim 1, further comprising, subsequent to the high-energy ion implantation process, removing the portion of the polysilicon film above the reserved region using an etching process, thereby forming a polysilicon layer constituted by the remainder of the polysilicon film.

8. The manufacturing method of claim 5, wherein a length of the top surface of each body region is greater than a length of the bottom surface of the corresponding body region.

9. A semiconductor device manufactured by the manufacturing method of claim 1.

10. The semiconductor device according to claim 9, which comprises a laterally diffused metal-oxide semiconductor device.

* * * * *